(12) United States Patent
Lin

(10) Patent No.: US 6,525,528 B2
(45) Date of Patent: Feb. 25, 2003

(54) ROM AUTOMATIC BURNING DEVICE

(75) Inventor: Yen-Sheng Lin, Jongli (TW)

(73) Assignee: Behavior Tech Computer Corporation, Taipei (TW)

( * ) Notice: Subject to any disclaimer, the term of this patent is extended or adjusted under 35 U.S.C. 154(b) by 9 days.

(21) Appl. No.: 09/900,862

(22) Filed: Jul. 10, 2001

(65) Prior Publication Data

US 2003/0014701 A1 Jan. 16, 2003

(51) Int. Cl.[7] ......................... G01R 31/02; B07C 5/344; H01L 21/66
(52) U.S. Cl. .................... 324/158.1; 209/573; 324/765; 438/15
(58) Field of Search ............................... 324/158.1, 765, 324/760, 537; 209/571, 573; 414/414; 711/103; 365/94, 96; 438/14, 15, 17

(56) References Cited

U.S. PATENT DOCUMENTS

| | | | | |
|---|---|---|---|---|
| 3,716,786 A | * | 2/1973 | Gearin | ........................ 324/760 |
| 4,588,092 A | * | 5/1986 | Moechnig et al. | ........ 324/158.1 |
| 4,703,858 A | * | 11/1987 | Ueberreiter et al. | ........ 324/537 |
| 5,998,751 A | * | 12/1999 | Brunelle | ..................... 209/573 |

* cited by examiner

Primary Examiner—Ernest Karlsen
(74) Attorney, Agent, or Firm—Rosenberg, Klein & Lee

(57) ABSTRACT

An automatic ROM burning device, comprising a support plate that is erected almost vertically. On the surface of the support plate is at least one feeder chute, inside which is inserted an IC rod, enabling the ROM component inside the IC rod waiting to be burned with data to lower in sequential order by gravity, while a moving mechanism moves it under the control of a control unit into a burner unit. The burner unit serves to conduct data burning and test operation on the components under the control of a control unit, and categorize the components according to the results obtained from the burning and testing operation. After data burning is completed, a moving mechanism delivers the components to a moving unit, moving the categorized components to separate discharge troughs; those of the same category are guided into empty IC rods for discharge. Therefore, under the control of the control unit, several ROM components are processed in data burning, categorized and delivered into the discharge IC rods of respective categories.

11 Claims, 10 Drawing Sheets

ROM AUTOMATIC BURNING DEVICE

BACKGROUND OF THE INVENTION

1. Field of the Invention

This invention relates to an automatic ROM burning device, particularly to one to process automatic data burning operation on several ROM components in sequential order.

2. Background of the Invention

In the continued development of personal computer and related computer products, there has been increasing demand for memory units, particularly ROM, which has better capacity for the registry of large amounts of data, as compared to DRAM and SRAM. Though it is impossible to directly provide the functions of data refreshing and renewed registration during the process of circuit operation, it has sufficient capacity to provide large amount of data that are stored within, which enabled quite extended range of applications of ROMs in electronic circuitry, such as the BIOS system for booting circuits in a computer motherboard, or the game cartridges for TV games.

Due to increased demand in commercial markets, the production of ROMs has been increased significantly. However, along with it comes the weakness that, the ROM's data burning and subsequent testing processes have always relied on manual labor for such a long time, resulting in poor production efficiency and unsatisfactory quality of data burning, hence failure of effective upgrading of production capacity and reduction of production costs, causing adverse effects on industrial advancement. Therefore, the industry needs an automatic device that will be able to speedily and accurately conduct data burning and subsequent testing processes on large amounts of ROMs, and assort the ROM components after they are burned and tested, according to burning and testing results, for application to different electronic devices or facilities.

SUMMARY OF THE INVENTION

The primary objective of this invention is to provide an ROM automatic burning device, for mass data burning and subsequent testing processes on large amounts of ROM components, to upgrade data burning efficiency and avoid human error that may be made in manual burning operation.

Therefore, the automatic ROM burning device comprises a support plate that is erected almost vertically. On the surface of the support plate is at least one feeder chute, inside which is inserted an IC rod. So that the ROM components waiting to be burned inside the IC rod can be lowered by gravity in sequential order, and then they can be moved inside a burner unit under the control of a control unit. The burner unit performs data burning process on the components under the control of the control unit, and sorts the components according to test results. After data are burned, the moving mechanism delivers the ROM components into a moving unit, transferring the components to several discharge troughs according to their categories, guiding components of a same category into an empty IC rod for discharge purpose. Thus, under the control of the control unit, several ROM components can be processed for data burning and testing, before they are assorted and delivered to respective discharge IC rods of respective categories.

DETAILED DESCRIPTION OF PREFERRED EMBODIMENT

The drawings of preferred embodiment of this invention are described in following details to enable better understanding. As shown in FIGS. 1, 2, 3 and 4, which illustrate an automatic ROM burning device 10 of the invention. The automatic ROM burning device 10 involves a base 12, on which is an inclined burning device support plate 14. The support plate 14 is installed almost perpendicular to the base 12 to enable feeding operation using gravity, which will be described in the following paragraphs.

Figure 7:
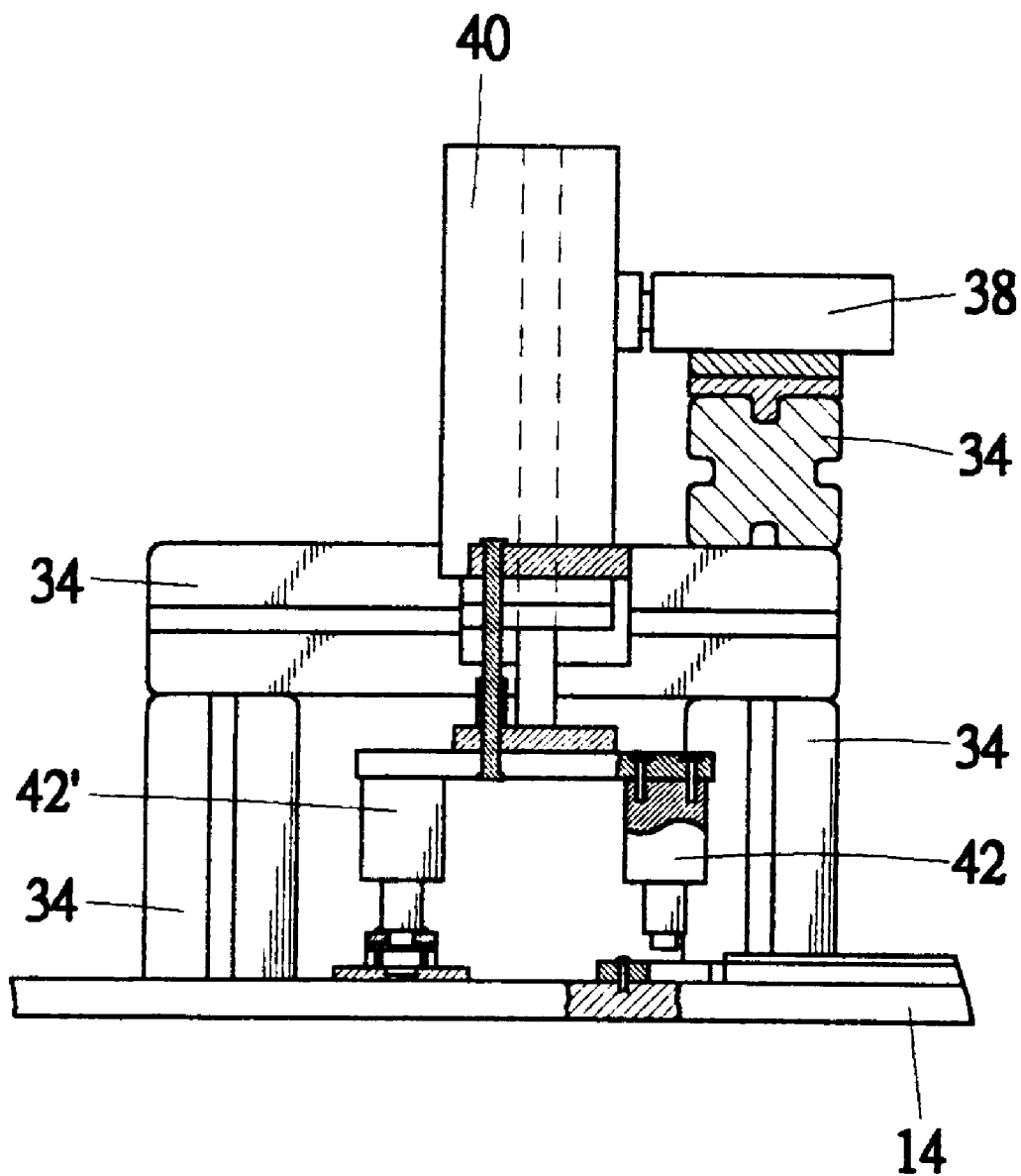
FIG. 7 is a side view showing the schematic structure between the attractors of the moving mechanism and the burner unit.
Figure 8:
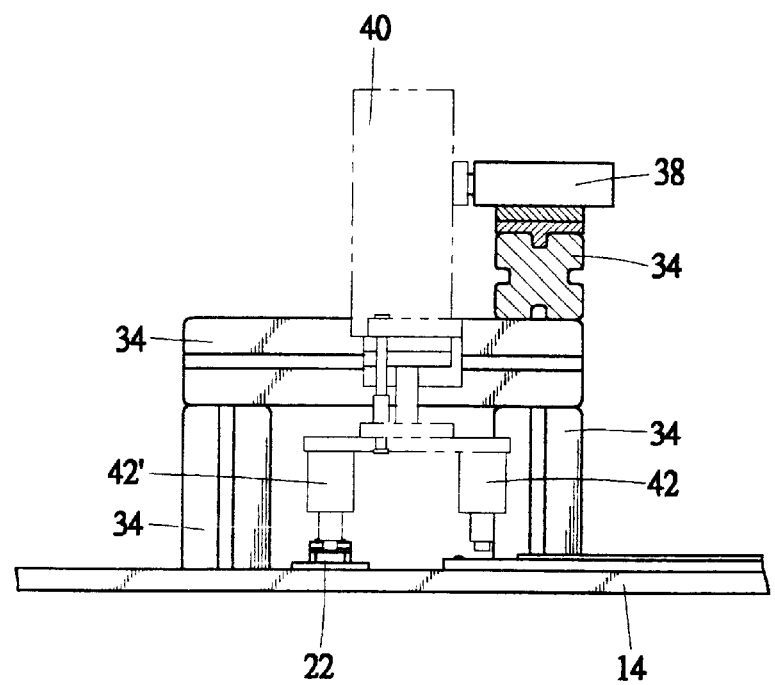
FIG. 8 is a side view of FIG. 7, but showing the attractors of the moving mechanism ready to attract the ROM component on the feeder chute and the burner unit.
Figure 9:
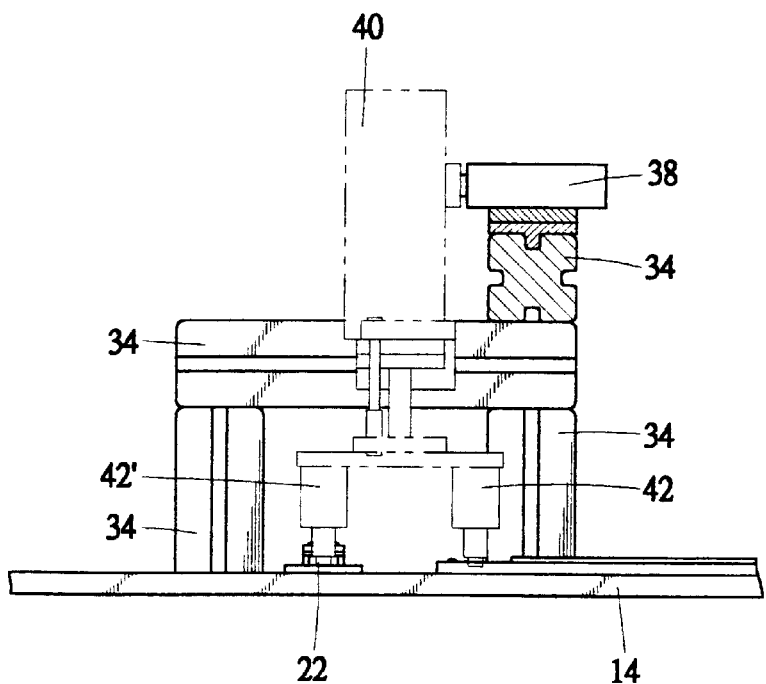
FIG. 9 is a side view similar to FIG. 7, showing the two attractors of the moving mechanism respectively attracting the ROM component on the feeder chute and the burner unit.

The support plate 14 has a top side, on the top side is installed a plurality of elongated feeder chutes 16 adhering onto the topside of the support plate 14, and extending upwards along the support plate 14. Inside each feeder chute 16 is a through a channel 28, running along the length of the chute, to accommodate an IC rod 20. As it is conventional practice in the packaging of chips or electronic components, several chips (in this invention, the chips are the ROM 22, as shown in FIGS. 7 and 8) are overlapped one on another and accommodated inside a hollow tube, this hollow tube is normally referred to as the "IC rod".

Below each feeder chute 16 is a burner unit 24, inside the burner unit the ROMs 22 to be burned and tested are lined one after another for data burning process and subsequent tests. The burner unit 24 is wired to a control unit 26, operating relevant data burning and tests under the control of the control unit 26; meanwhile, the control unit 26 also serves to sort the ROMs 22 according to the test results obtained after the burning process. This control unit 26 is a control unit having a central processor, such as a programmable logic control (or PLC). This control unit 26 serves not only to control and perform the data burning process and tests after the ROMs 22 are burned, but also to control the feeding of materials waiting to be burned, as well as the sorting and discharging operation after the test.

Figure 1:
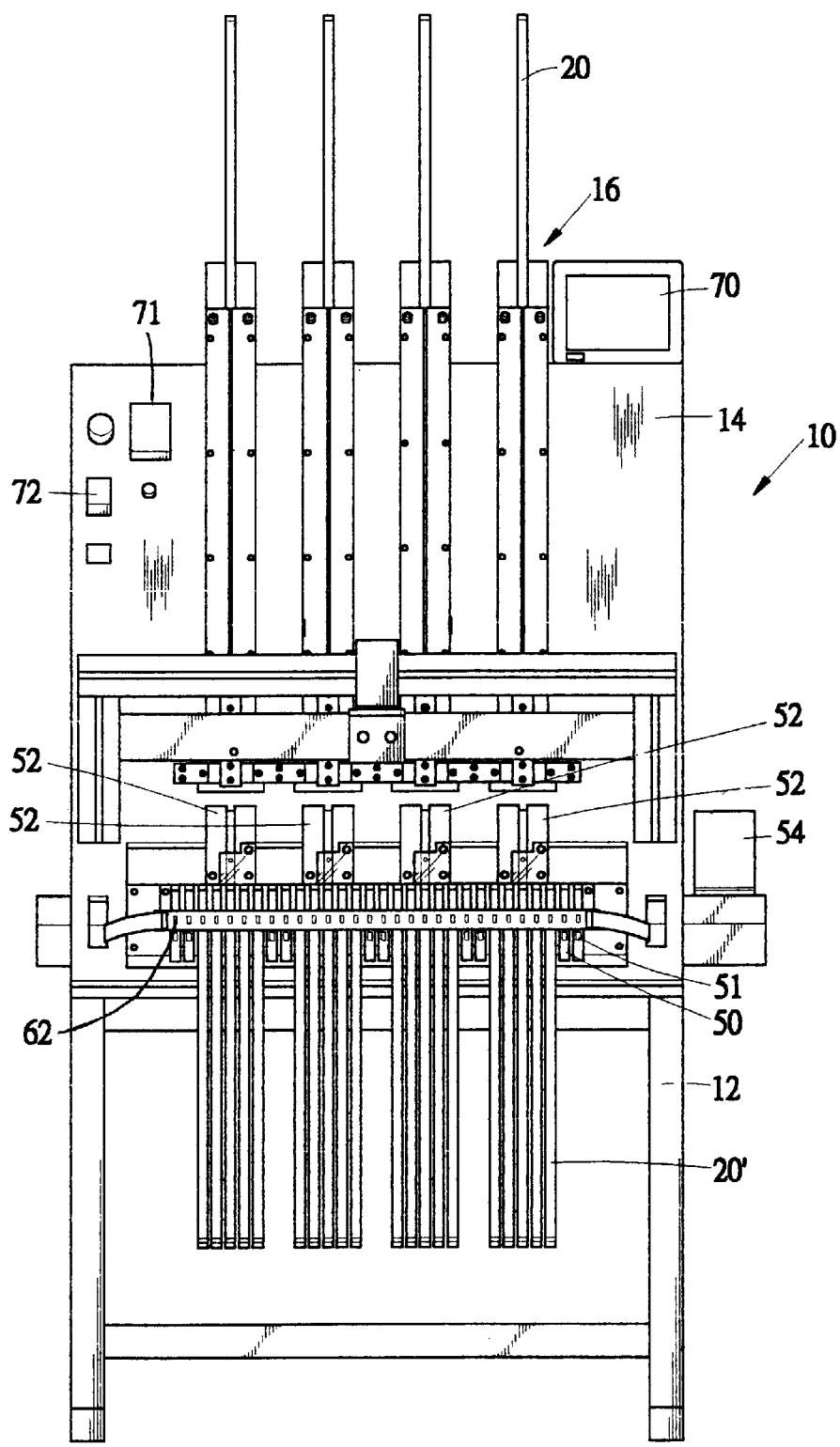
FIG. 1 is a front view of the invention of automatic ROM burning device.
Figure 2:
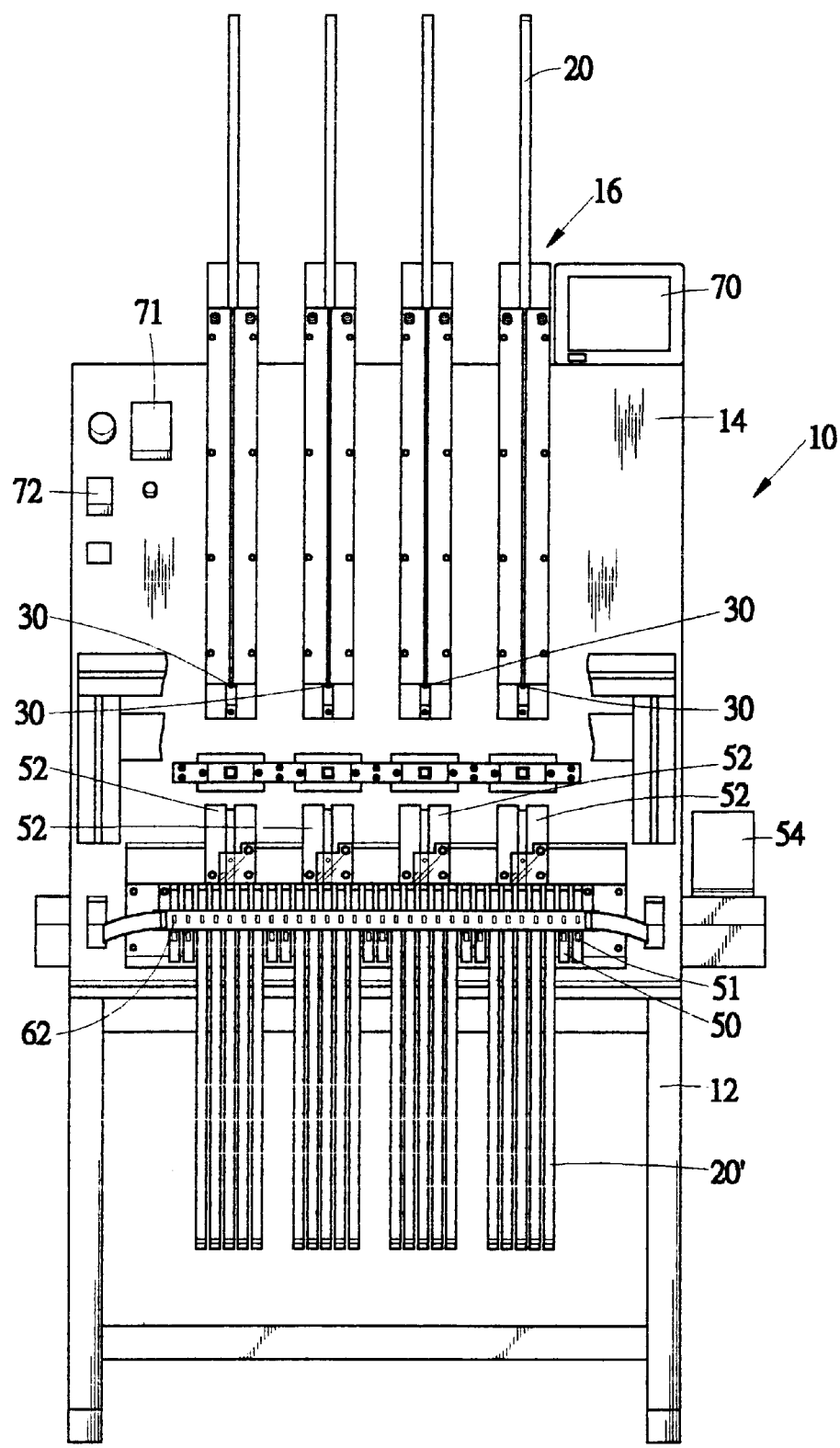
FIG. 2 is a front view similar to FIG. 1, showing the schematic structure between the feeder chute and the burner unit.
Figure 3:
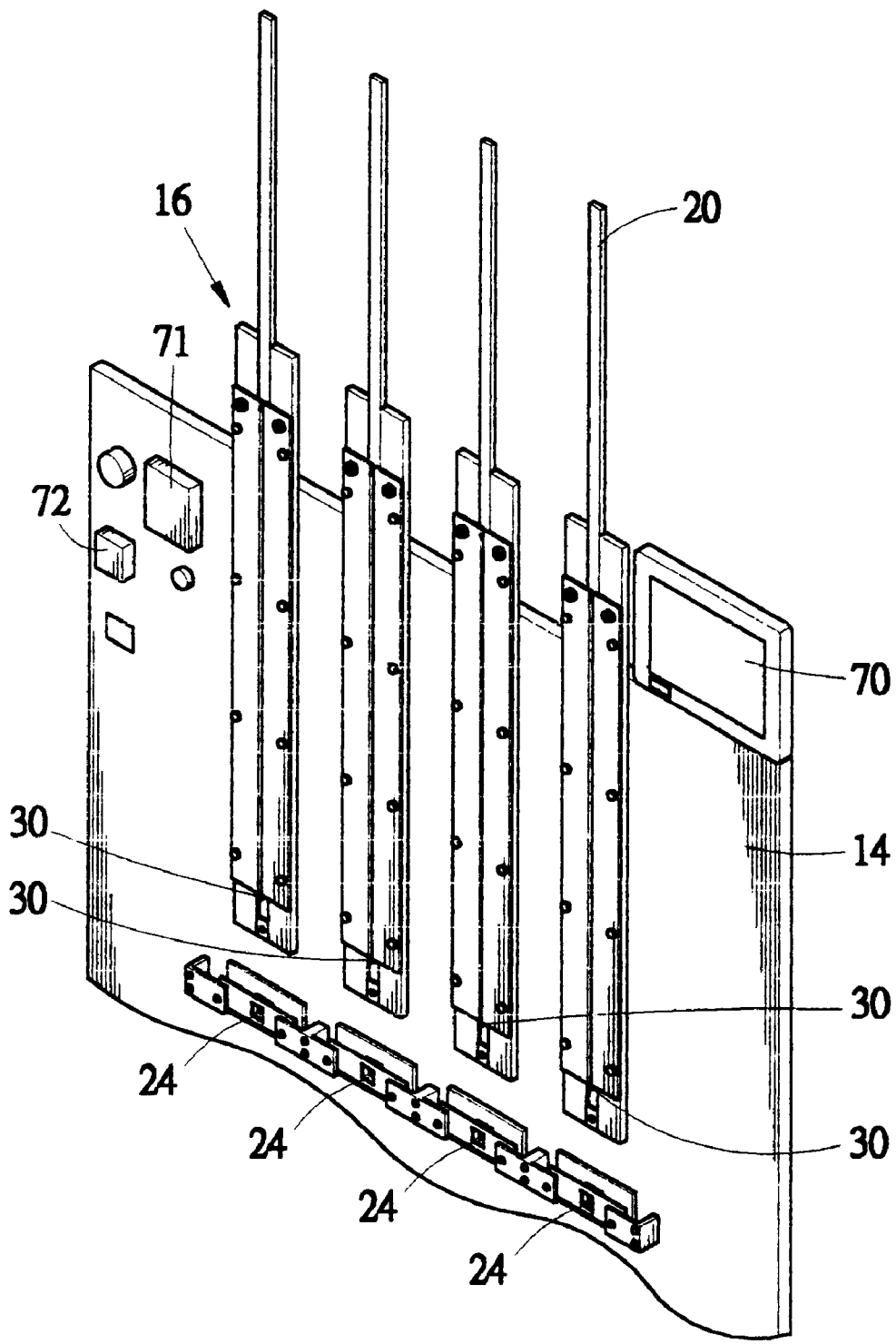
FIG. 3 is a blowup of the feeder chute and burner unit shown in FIG. 2.
Figure 4:
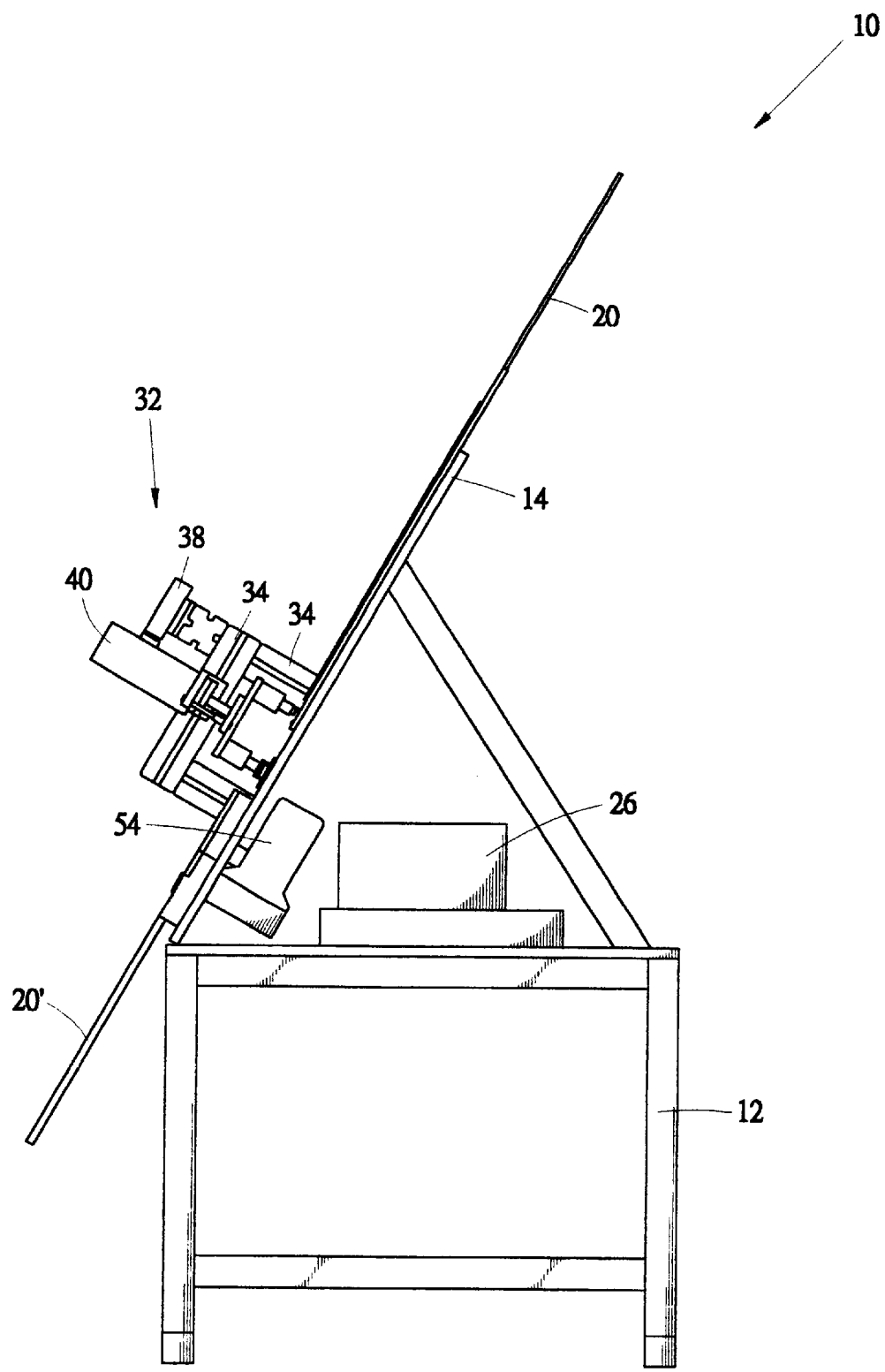
FIG. 4 is a side view of the invention of automatic ROM burning device.

FIGS. 2 and 3 respectively illustrate the schematic structure of the feeder chute 16. As described above, each feeder chute 16 has a through channel 28 extending along the length of the chute, to accommodate the insertion of the IC rod 20 containing the ROM 22. Since the feeder chute 16 is installed almost vertically, the IC rod 20 appears almost vertical after it 20 is inserted therein. Using gravity, the ROM 22 inside the IC rod 20 slides down one by one along the feeder chute 16. As shown clearly in FIGS. 2 and 3, at the lower end of each feeder chute 16, there is a check block 30 to stop the ROM 22 from sliding down any further. So that it is stopped at an appropriate position, which is referred to as feeding preparation position in the description of this invention.

According to the preferred embodiment of this invention, this check block 30 is positioned at the top of the burner unit 24, as shown in FIGS. 2 and 3. Therefore all ROMs 22 waiting to be burned shall pause at the feeding preparation position on top of the burner unit 24. FIGS. 2 and 3 have clearly illustrated the IC rod 20, but they have not shown the ROM's 22 standing by for burning process.

Figure 5:
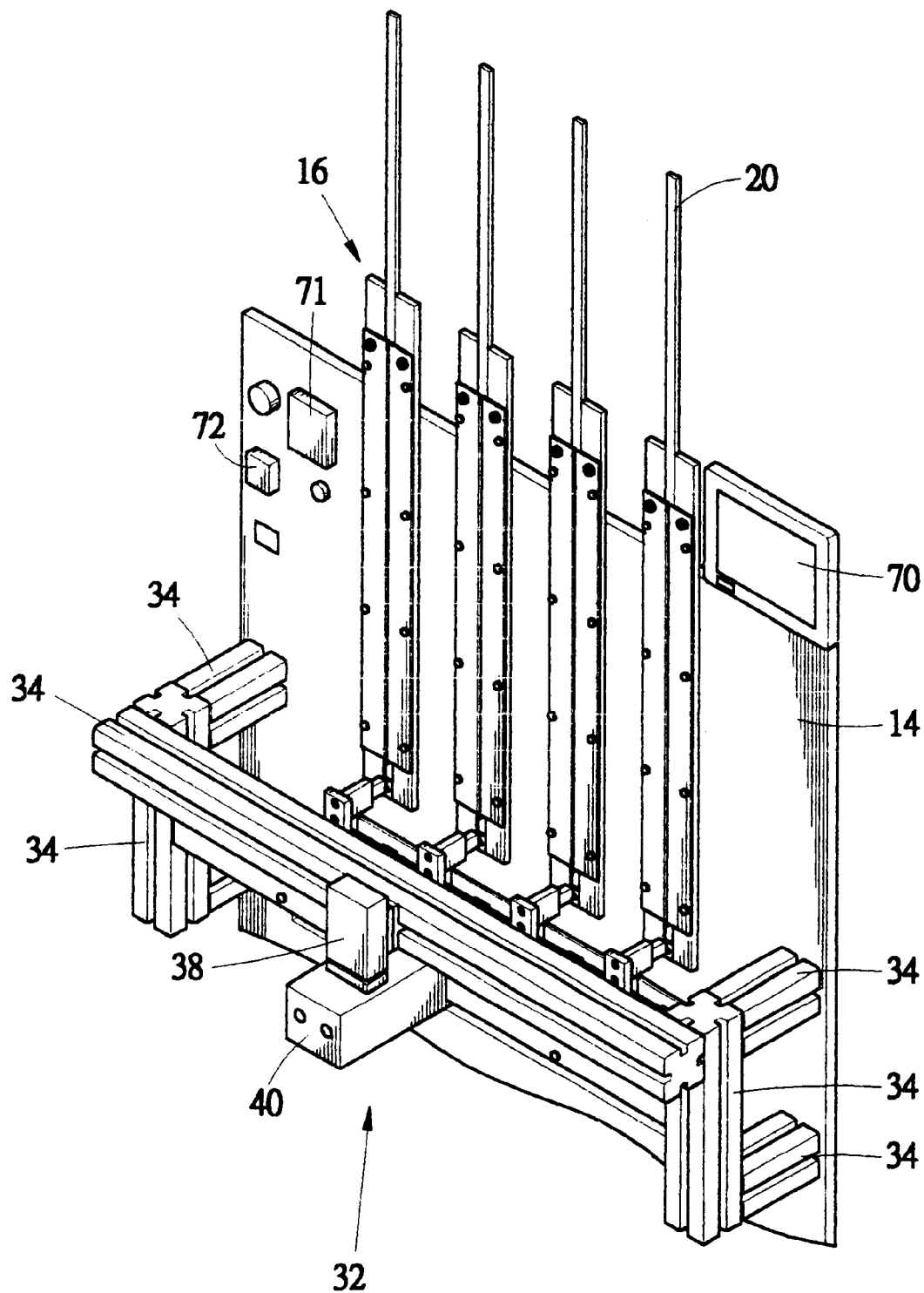
FIG. 5 is an external view of respective feeder chutes and the moving mechanism in the automatic ROM burning device of the invention.
Figure 6:
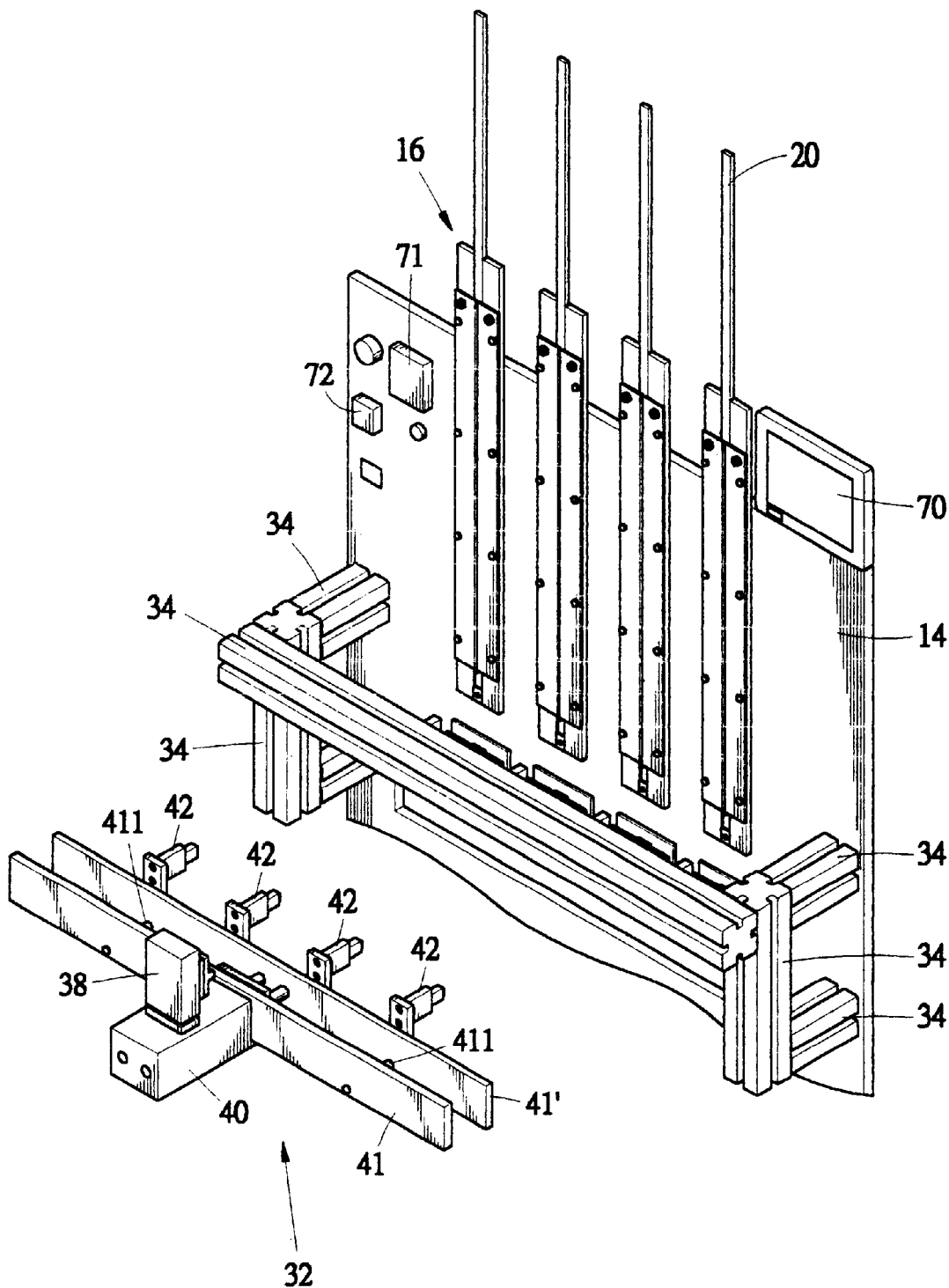
FIG. 6 is a blowup of FIG. 5, showing the schematic structure between moving mechanisms and the moving tracks.

As shown in FIGS. 5 and 6, each feeder chute 16 shears a moving mechanism 32 having a moving track 34 that is fixed on the support plate 14. On this moving track 34 is a first-direction linear moving device 38, providing linear movement along the first direction. Here, the first direction refers to the direction along the length (or, longitudinal direction) of the feeder chute 16. The moving mechanism 32 also comprises a second-direction linear moving device 40, which is installed on the first-direction linear moving device 38, and is driven thereby in upward movement in the first direction. This second-direction linear moving device 40 itself enables linear movement along the second direction. Based on the preferred embodiment of the invention, this second direction is perpendicular to the first direction, and perpendicular to the surface of the support plate 14.

The second-direction linear moving device 40 is joined at its downside to a base plate 41.Two sides of this base plate 41 are embedded on the moving track 34, so the base plate 41 is driven, along with the second-direction linear moving device 40, by the first-direction linear moving device 38, to move synchronously toward the first direction. The second-direction linear moving device 40 is joined at its downside to a base plate 41'. Between this base plate 41' and the base plate 41 are several supporting pillars 411 (shown in FIGS. 6 and 7), so the base plate 41' can be driven by the second-direction linear moving device 40 to move in the second direction. At the front and rear of the base plate 41' are respectively fitted with several pairs of attractors 42 and 42', which move in the first and second directions, as they are driven to move along with the first-direction linear moving device 38 and the second-direction moving device 40. The attractors 42 and 42' are communicating with a vacuum source (not shown in drawing), thus creating a vacuum suction force. The first-direction linear moving device 38 and the second-direction linear moving device 40 can be any known device that provides linear movement, such as a pneumatic cylinder or other similar devices.

The moving mechanism 32 is so designed that, under the control of the control unit 26, the attractors 42 and 42' move along the second direction toward the support plate 14, and, the distance between these pairs of attractors 42 and 42' is so designed that, when they approach the support plate 14, one of which is aligned to the first ROM 22 at the feeding preparation position on top of the check block 30 (in other words, the ROM 22 at the lowermost part of the feeder chute 16), while the other is aligned to the burner unit 24, thereby the vacuum sucking force will attract and move the first ROM component, waiting to be burned, on top of the check block 30 and the burned and tested ROM component inside the burner unit 24. Detailed description of operation will come later.

Figure 10:
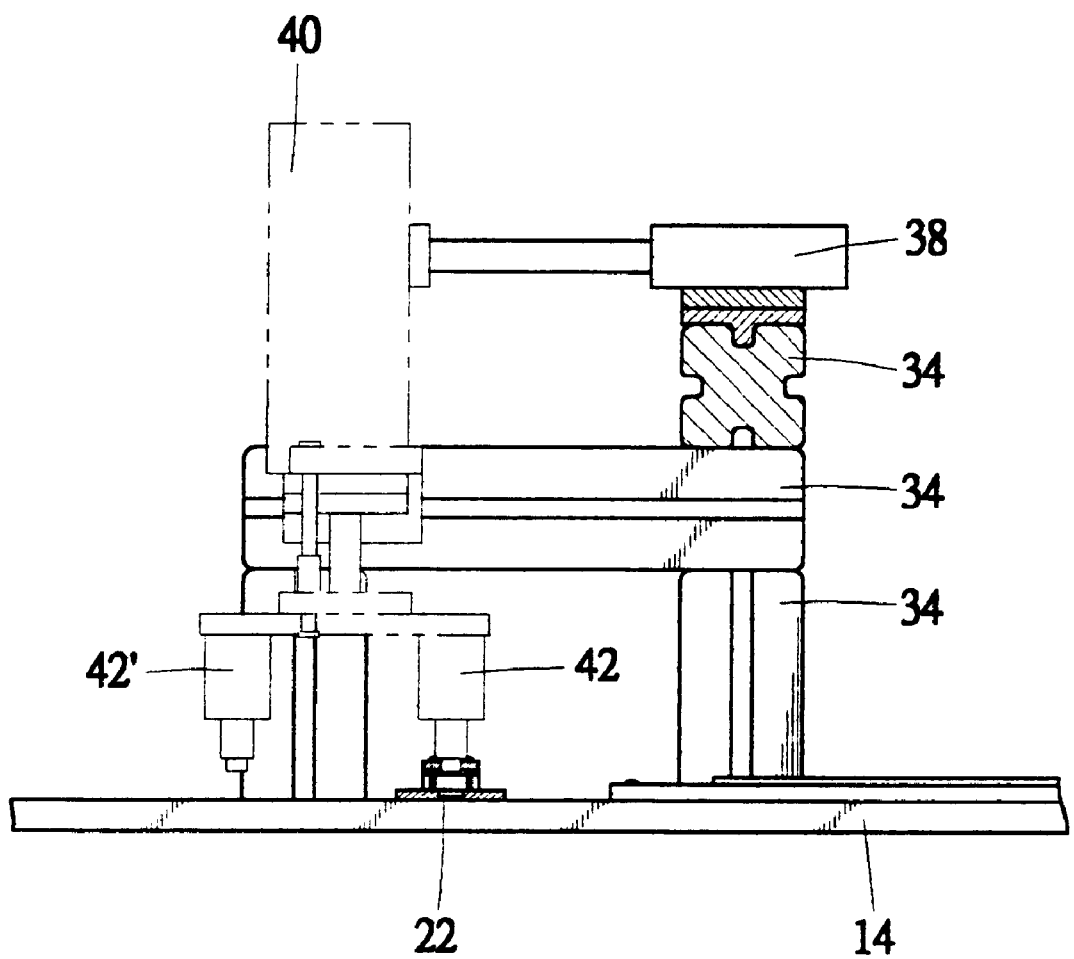
FIG. 10 is a side view, showing the two attractors of the moving mechanism moving longitudinally after having attracted the ROM components.
Figure 11:
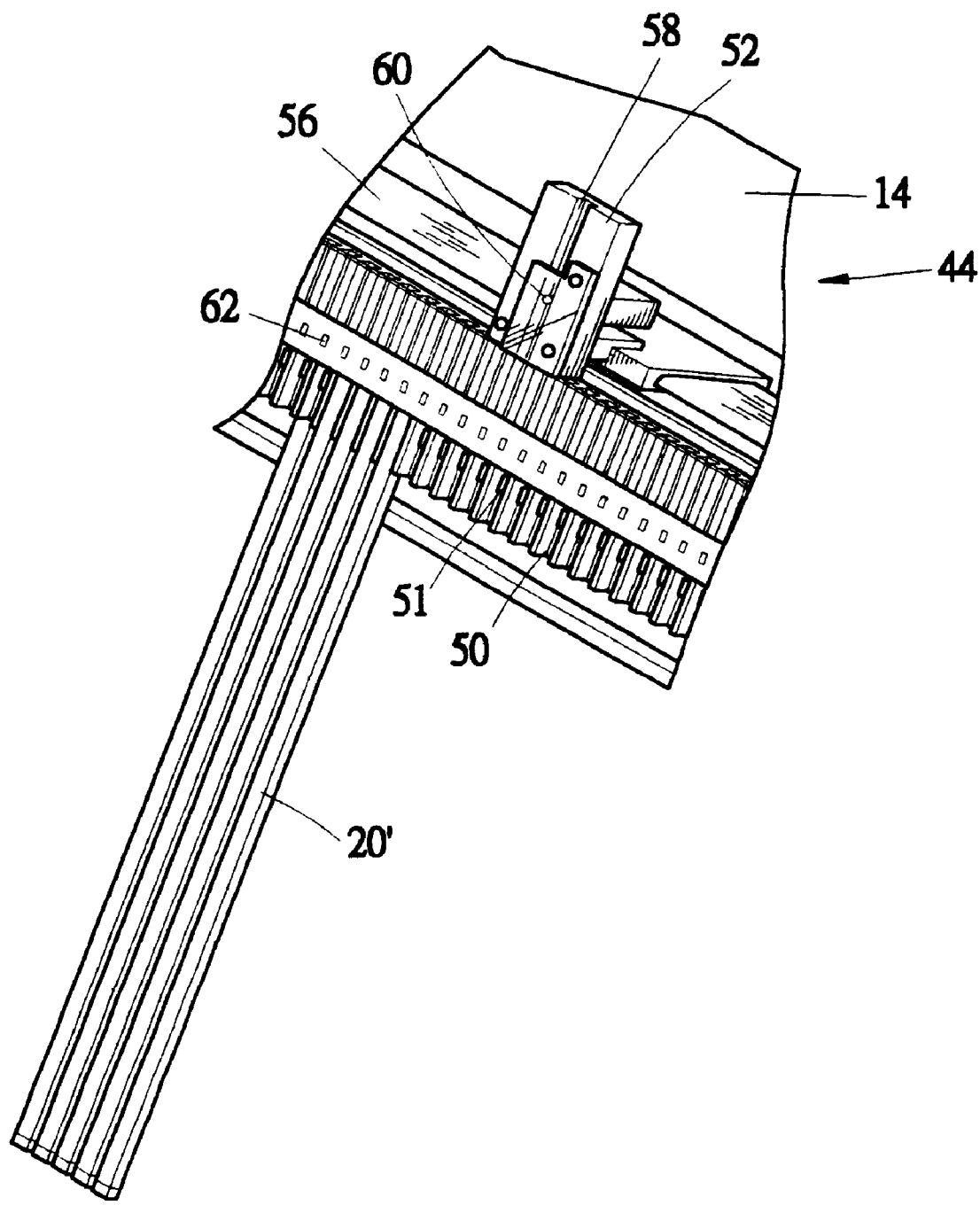
FIG. 11 is an external view of the ROM sorting device of the invention automatic ROM burning device, with related discharge device.

As shown in FIGS. 7, 8, 9 and 10, the pairs of attractors 42 and 42', under the control of the second-direction linear moving device 40, drive the base plate 41 downward, so that when the attractors have attracted the ROMs (shown in FIG. 9), the first-direction linear moving device 38 moves the ROM attracted on the attractors 42 and 42' in the first direction that is parallel to the support plate 14, and move the component waiting to be burned onto the burner unit 24, and at the same time, moves the burned and tested component into the sorting device 44 (referring to FIG. 11).

The movement of the first-direction linear moving device 38, the second-direction linear moving device 40 and the attractors 42, 42' is controlled by the control unit 26 to perform feeding of the components waiting to be burned and the discharge of burned and tested components.

When the first ROM component at the feeding preparation position on top of the check block 30 is removed by the moving mechanism 32 (as shown in FIG. 10), the second ROM component on top will slide down, due to gravity, to where the check block 30 is (the feeding preparation position), waiting to be moved into the burner unit 24 for the next feeding process.

FIGS. 1, 2, 4 and 11 illustrate the sorting devices 44 respectively match the burner units 24, below them are several discharge troughs 50. In actual use, these discharge troughs 50 can be used simultaneously to suit the circumstance, or some of them can be used selectively. Each discharge trough 50 has an outlet at its lower part, accommodating the insertion of an empty IC rod 20', to receive the burned and tested ROM components after they are sorted. Sorting can be made to categorize burned and tested products that are considered as regular and irregular, or to categorize them according to the types of data burned onto them. Each discharge trough 50 corresponds to an ROM component of a certain category. As shown in FIG. 10, each burner unit 24 uses and matches only five of the discharge troughs 50, each of these five discharge troughs 50 is inserted in an empty IC rod 20', indicating that the burned and tested ROM components will be categorized in five types according to the results of the burnings and tests.

In each discharge trough 50 is a micro switch 51, to detect the insertion of an induction IC rod 20'. This micro switch 51 is wired to the control unit 26, enabling the control unit 26 to confirm that an IC rod 20' is inserted in the discharge trough 50. Each sorting device 44 also comprises a moving unit 52 that can move under the control of the control unit 26, moving to the inlets of said discharge troughs 50, or they can respectively stop at the lower part (the discharge preparation position) of the burner unit 24 matching respective feeder trough 16, enabling the moving mechanism 32 to move the tested ROM components into it. The horizontal movement of the moving unit 52 can be conducted by any appropriate, known linear movement device, such as driven by an electric motor 54 along a straight rack 56.

Inside the moving unit 52 is a through channel 58, which accommodates the ROM component to stay therein. In the channel 58 is a check key 60, which can obstruct the ROM component in the channel 58 of the moving unit 52, so the ROM component can move with the moving unit 52 to an appropriate discharge trough 50. The check key 60 can be retracted by the control of the control unit 26, so the ROM component can slide out of the channel 58. When the moving unit 52 moves to the appropriate discharge trough 50, the ROM component is discharged into the discharge trough 50, and enters into the IC rod 20' that is inserted therein.

The check key 60 can be controlled by a solenoid or a pneumatic cylinder, while the solenoid or pneumatic cylinder is controlled by a control unit 26.

On each discharge trough 50 is a sensor 62 to detect the passage of an ROM out of the discharge trough 50, thereby the quantity of ROM components that have entered the discharge trough 50 and contained in respective IC rods 20' is calculated, and a notice is given to the control unit 26 when the IC rod 20' is filly filled, to interrupt operation until an operator has replaced a new empty IC rod 20'. Based on the preferred embodiment of the invention, the sensor 62 is preferably a photoelectric sensor that produces a pulse signal whenever an ROM component passes, so the number is counted, and meanwhile, it produces a step function signal when an IC rod 20 is fully filled, to advise the control unit 26.

In actual operation, after an ROM component processes data burning and testing inside the burner unit 24 of each feeder chute 16 and the moving mechanism 32 moves it to the moving unit 52, the control unit 26 will control the moving unit 52 according to the results of burning and testing performance, and move the ROM to the discharge trough 50 of corresponding category, and then retract the check key 60, so that the ROM slides into the discharge trough 50 by gravity and enters an IC rod 20' of respective category.

Based on this invention, preferably there is a sensor (not shown in drawings) installed on the burner unit 24 matching each feeder chute 16, to detect whether there is an ROM component waiting inside to be burned and tested. This sensor can be a photoelectric sensor, which comprises a light emitting element and a light sensitive element respectively installed on two opposite sides of the burner unit 24.

Furthermore, on the support plate 14 are installed necessary measuring panels and meters, such as a touch control display board 70 for display and input of operating commands, an indicator lamp 71 for indicating the status of operation, as well as a start switch 72 and an operation indicator lamp 71 for the burning device. Since they are well known to people skilled in this art, it needs no elaboration here.

What is claimed is:

1. An automatic ROM burning device, comprising:
    a support plate, having a surface that is almost vertically installed;
    at least one feeding device, installed on the surface of the support plate, serving to accommodate a plurality of ROM components waiting to be tested, said components ready for the burning process moving one by one along the surface of the support plate by means of gravity to a feeder preparation position;
    a sensor unit, installed at a position matching at least one feeder device, enabling said feeder device to receive said ROM components one by one for data burning and subsequent testing processes of said components;
    a control unit, serving to control the data burning and testing processes;
    a moving mechanism, having a first-direction linear moving device and a second-direction linear moving device, the second-direction linear moving device being combined with a first-direction linear moving device, controlled by the first-direction linear moving device to move in the first direction, to the lower part of the second-direction linear moving device being linked to several pairs of attractors, controlled by the first-direction linear moving device to move in the first direction to keep in line with the feeder preparation position of the feeder device and the burner unit, then moved by the second-direction linear moving device to move in the second direction, while the attractors respectively take up the ROM components waiting to be burned and those already burned and tested from the feeder preparation position and the burner unit, and driven by the second-direction linear moving device and the first-direction linear moving device, the ROM components waiting to be burned and those already burned and tested and taken up by the attractors respectively positioned on the burner units and discharge preparation positions; and at least one sorting device, comprising a plurality of discharge troughs, each discharge trough having an inlet and an exit, said exit being installed that the take-up container of a burned and tested ROM can be connected thereto, in order to take up burned and tested components, one moving unit that is capable of moving between the discharge preparation position and the inlet of said plurality of discharge trough, to enable the attractors of the moving mechanism to take up the ROM components that are already burned and tested, and under the control of the control unit according to the results of the data burning and testing performance, move to the inlet corresponding to the discharge trough, and deliver the component into said discharge trough, and move it to the ROM container of related category.

2. The automatic ROM burning device as claimed in claim 1, wherein said feeding device comprises a feeder chute that is installed almost vertically along the surface of the support plate, inside which being accommodated several ROM components waiting to be burned by overlapping them one on the other, said feeder preparation position being defined by a check block that is fixed inside said feeder chute, the ROM component waiting to be burned moving to said check block by means of gravity.

3. The automatic ROM burning device as claimed in claim 1, wherein said moving mechanism comprises a moving track, to accommodate the installation of a first-direction linear moving device; a second-direction linear moving device being joined to a base plate, the two ends of said base plate being embedded on a moving track, to move with the first-direction linear moving device in the first direction.

4. The automatic ROM burning device as claimed in claim 1 or 3, wherein a base plate is joined to the lower part of the second-direction linear moving device of said moving mechanism, the base plate being connected by several supporting pillars to the base plate, enabling the connection of respective attractors to its front and rear, the attractors being capable of movement in the first direction and the second direction under the control of the first-direction linear moving device and the second-direction linear moving device.

5. The automatic ROM burning device as claimed in claim 1, wherein the attractors of said mover unit is connected with a vacuum pressure source, capable of taking up or releasing ROM components under the control of said control unit.

6. The automatic ROM burning device as claimed in claim 1, wherein the moving unit of said sorting device has channels, an inlet, which serves to take up the burned and tested ROM components released by the moving mechanism, and an outlet serving to release the ROM components to a matching discharge trough, inside said channel being a retractable check key serving to retain the ROM component temporarily in said channel, said check key can be retracted by the control of the control unit to allow the ROM component to pass said channel and be released from the outlet.

7. The automatic ROM burning device as claimed in claim 1, wherein at the outlet of said discharge trough is a micro switch, which can be activated when the take-up container of the burned and tested ROM component is connected to said outlet, to transmit a related signal to said control unit.

8. The automatic ROM burning device as claimed in claim 1, wherein inside each discharge trough is an ROM passage sensor to detect the passage of each ROM component through said discharge trough, and calculate the quantity of ROM components in said discharge trough.

9. The automatic ROM burning device as claimed in claim 8, wherein said sensor comprises a photoelectric sensor that produces a pulse signal whenever an ROM component passes, serving to count the number of ROM components, and, after each respective ROM component container is filled with ROM components, to send a full-load signal to the control unit to stop the discharge and delivery of burned and tested components.

10. The automatic ROM burning device as claimed in claim 1, wherein said burner unit comprises a photoelectric sensor that is wired to said control unit, to detect whether there is any ROM component inside the burner unit waiting to be burned and tested.

11. The automatic ROM burning device as claimed in claim 1, wherein said discharge troughs are arranged in a row, their inlets installed neatly in straight lines, wherein the moving unit of said sorting device can move in a straight line along a track, under the control of the control unit, to the inlet of any discharge trough.

* * * * *